US005508207A

United States Patent [19]
Horai et al.

[11] Patent Number: 5,508,207
[45] Date of Patent: Apr. 16, 1996

[54] METHOD OF ANNEALING A SEMICONDUCTOR WAFER IN A HYDROGEN ATMOSPHERE TO DESORB SURFACE CONTAMINANTS

[75] Inventors: Masataka Horai; Naoshi Adachi; Hideshi Nishikawa; Masakazu Sano, all of Saga, Japan

[73] Assignee: Sumitomo Sitix Corporation, Hyogo, Japan

[21] Appl. No.: 199,170

[22] PCT Filed: Jun. 25, 1993

[86] PCT No.: PCT/JP93/00865

§ 371 Date: Apr. 26, 1994

§ 102(e) Date: Apr. 26, 1994

[87] PCT Pub. No.: WO94/00872

PCT Pub. Date: Jan. 6, 1994

[30] Foreign Application Priority Data

Jun. 29, 1992 [JP] Japan ................... 4-196576

[51] Int. Cl.$^6$ ................ H01L 21/306; H01L 21/324
[52] U.S. Cl. ............ 437/13; 437/247; 148/DIG 22; 148/DIG. 24; 148/DIG. 3; 117/906
[58] Field of Search ............. 148/DIG. 3, DIG. 22, 148/DIG. 24; 117/3, 906; 437/13, 247

[56] References Cited

U.S. PATENT DOCUMENTS

| | | | |
|---|---|---|---|
| 4,151,007 | 4/1979 | Levinstein et al. | 437/247 |
| 4,154,873 | 5/1979 | Hickox et al. | 437/247 |
| 4,192,720 | 3/1980 | Bucker et al. | |
| 4,312,681 | 1/1982 | Rupprecht et al. | 437/247 |
| 4,431,708 | 2/1984 | Carver et al. | |
| 4,432,809 | 2/1984 | Chye et al. | 437/247 |
| 4,844,719 | 7/1989 | Toyomoto et al. | |
| 4,888,305 | 12/1989 | Yawazaki et al. | |
| 5,194,928 | 3/1993 | Cronin et al. | |
| 5,210,056 | 5/1993 | Pong et al. | 437/247 |
| 5,213,670 | 5/1993 | Bertasnolli et al. | |

FOREIGN PATENT DOCUMENTS

| | | | |
|---|---|---|---|
| 0131717 | 1/1985 | European Pat. Off. | |
| 3142589 | 5/1983 | Germany | |
| 221309A1 | 12/1983 | Germany | 148/DIG. 3 |
| 60-249336 | 12/1985 | Japan | 148/DIG. 3 |
| 61-150340 | 7/1986 | Japan | |
| 4-167433 | 6/1992 | Japan | |

OTHER PUBLICATIONS

Translation of JP 4–16744.
Translation of JP 60–249336.
Malbon, R. M., et al., J. Electro Chem. Soc. vol. 133, #9 (1976) 1413.
Ghandhi, S. K., "VLSI Fab, Principles" J. Wiley & Sons, N.Y. 1983.
Guha, S. et al, Sol. State Electr, vol. 20 (1977) 27.

*Primary Examiner*—Brian E. Hearn
*Assistant Examiner*—Leon Radomsky
*Attorney, Agent, or Firm*—Breiner & Breiner

[57] ABSTRACT

The present invention provides a method of manufacturing a semiconductor wafer whereby (1) deterioration of a micro-roughness in a low temperature range in hydrogen atmospheric treatment and increase of resistivity due to outward diffusion of an electrically active impurity in a high temperature range are prevented; (2) in the heat treatment in a hydrogen gas atmosphere, the concentration of gas molecules in the atmosphere, such as water, oxygen and the like, are brought to 5 ppm or less in water molecule conversion; and a reaction is suppressed in which a substrate surface is oxidized unequally and the micro-roughness deteriorates; and (3) the same kind of impurity as the electrically active impurity contained in a Si substrate is mixed into the atmosphere and the outward diffusion of the impurity in the vicinity of the Si substrate surface is prevented to prevent variation of the resistivity.

1 Claim, 2 Drawing Sheets

METHOD OF ANNEALING A SEMICONDUCTOR WAFER IN A HYDROGEN ATMOSPHERE TO DESORB SURFACE CONTAMINANTS

FIELD OF INVENTION

The present invention relates to a method of manufacturing semiconductor silicon wafers, in particularly, to a method of manufacturing a semiconductor silicon wafer capable of improving characteristics and yields of a semiconductor device by improving crystal quality in the vicinity of the wafer surface which is an active region of the semiconductor device.

BACKGROUND OF THE INVENTION

A basic structure of a MOS-type large scale integrated device, such as an LSI, VLSI and the like, is constituted by a MOS-type transistor and a MOS-type capacitor and the like. Further, in a gate portion of the transistor, a thin thermal oxide film, i.e., gate oxide film, of several hundreds A which is grown by thermal oxidation of a silicon substrate is used.

Insulation pressure resistance, i.e., dielectric breakdown, characteristics of the gate oxide film [i.e., gate oxide integrity, (GOI)] depends largely on the crystal quality in the vicinity of the silicon substrate surface being used, and affects the reliability and yields of the large scale integrated device, such as the LSI, VLSI and the like.

A proposed method for solving such problems, for example, as shown in Japanese Patent Laid Open Application No. Sho 60-231365, 61-193456, 61-193458, 61-193459, 62-210627 and Hei 2-177542, is a heat treatment technique of a semiconductor substrate in a hydrogen gas atmosphere whereby the silicon oxide film and silicon oxide particles existing on the silicon substrate surface and oxygen precipitates existing in the vicinity of the silicon substrate surface are eliminated by a hydrogen reduction effect by heating the silicon substrate in a hydrogen atmosphere at 950° C. to 1200° C. for 5 minutes or longer.

When heating the silicon substrate in the hydrogen atmosphere, due to very small amounts of impurities in the air such as oxygen and water mixed in the atmosphere, haze occurs on the silicon wafer surface due to deterioration of a micro-roughness. Hereupon, the micro-roughness is defined as a fine surface roughness of several Å to several tens Å high.

Such deterioration of the micro-roughness is remarkably seen in an effective temperature range of the hydrogen atmospheric heat treatment, particularly, in a low temperature range of 950° C. to 1050° C.

A problem was thus encountered where the GOI characteristics which were to be improved were, on the contrary, degraded due to the deterioration of the micro-roughness.

In the case of employing the hydrogen atmospheric heat treatment before a device process, a more effective high temperature range (1050° C. to 1200° C.) can be utilized to improve the crystal quality in the vicinity of the silicon surface.

This temperature range is advantageous in that a crystalline property of the silicon substrate is improved due to the outward diffusion of an oxygen impurity contained in a CZ-Si substrate besides the hydrogen reduction effect.

However, the electrically active impurities, such as B and P, also diffuse outwardly simultaneously and resistivity increases near the surface. Thus another problem exists in that the desired resistivity can not be obtained.

It is an object of the present invention to provide a method of manufacturing a semiconductor wafer capable of solving problems such as deterioration of the micro-roughness in the low temperature range in a hydrogen atmospheric treatment and to increase resistivity due to outward diffusion of the electrically active impurities in a high temperature range.

BRIEF DESCRIPTION OF THE INVENTION

For the purpose of providing a method of manufacturing a semiconductor wafer which solves deterioration of the micro-roughness in a low temperature range in a hydrogen atmospheric treatment and to increase resistivity in a high temperature range, as a result of various studies carried out on hydrogen atmospheric treatment conditions, the inventors have found that, in heat treatment in a hydrogen gas atmosphere, it is possible to suppress the reaction in which a substrate surface is oxidized unequally and the micro-roughness is deteriorated by bringing the concentration of gas molecules in air, such as water, oxygen and the like, below 5 ppm in water conversion, and furthermore, to prevent the outward diffusion of the impurity in the vicinity of the Si substrate surface to prevent variation of the resistivity by mixing the same kind of impurity gas as the electrically active impurity contained in the Si substrate into the atmosphere.

That is, the present invention is directed to a method of manufacturing a semiconductor wafer characterized by, in a heat treatment process of a semiconductor substrate in a hydrogen gas atmosphere, bringing the gas molecule concentration of water in the heating atmosphere below 5 ppm for heat treatment.

Particularly described, the method is characterized by a method of manufacturing a semiconductor wafer whereby a CZ-Si semiconductor substrate is heated in a hydrogen gas atmosphere by using an epitaxial reaction furnace, such as a low pressure CVD furnace or the like, and bringing oxidizing gas molecules such as water, oxygen and the like below 5 ppm in water conversion in the heat treating atmosphere for heat treatment.

The present invention proposes a method of manufacturing a semiconductor wafer as above-mentioned by mixing gas containing the same kind of impurity as the electrically active impurity contained in the semiconductor substrate being treated into the heating atmosphere at a predetermined concentration.

It is possible for the present invention to annihilate Si dioxide particles existing on the CZ-Si substrate surface and fine oxygen precipitates existing in bulk in the vicinity of the CZ-Si substrate surface by hydrogen reduction by the heat treatment in the hydrogen gas atmosphere.

Furthermore, by bringing the concentration of oxidizing gas molecules such as water, oxygen and the like below 5 ppm in water molecule conversion in the heating atmosphere, the reaction can be suppressed wherein the silicon substrate surface is reduced unequally by hydrogen after being oxidized and the micro-roughness of the silicon substrate surface is deteriorated.

Generally, a partial pressure P (atom) of an impurity in a gaseous phase which is in an equilibrium state with a solid phase containing a volatile impurity at a concentration N (atoms/cm$^3$) at a certain temperature, which is given by the following formula according to Henry's law:

$$N = H \cdot p$$

where H is a constant determined by the temperature and the kind of solid and impurity.

For example, in the case of a silicon single crystal, B in the silicon and $B_2O_3$ in the gaseous phase at 1100° C., $H=2\times10^{25}$ atoms($cm^3$·atom).

Thus, since the outward diffusion or evaporation of the impurity in the vicinity of the silicon substrate surface is suppressed by a partial pressure of gas containing an electrically active impurity contained in the silicon substrate, for example the same kind of impurity as P, B, As, Sb and the like, mixed with a partial pressure satisfying the aforementioned relationship at the heating temperature, variation of the resistivity in the vicinity of the silicon substrate surface can be prevented.

In the present invention, a method of bringing the concentration of water or oxygen molecules in the hydrogen atmospheric heat treatment below 5 ppm in water molecule conversion can be effected in any known heat treatment furnace and is not particularly limited. For example, when using a general epitaxial reaction furnace, since there is contact with the outside atmosphere at the time of loading the semiconductor substrate and although there may be a fear of absorbing water molecules, absorption of the water molecules at the time of contact with the atmosphere can be suppressed by maintaining the temperature of the heating table at 300° C. or more at the time the semiconductor substrate is placed on the table.

Also, in a furnace, such as an epitaxial reaction furnace whose internal temperature at the time of loading the substrate is greater than room temperature by 300° C. or less, after placing the semiconductor substrate on a heating table, atmospheric gas in the furnace is substituted by nitrogen gas, and while substituting further with hydrogen gas, the temperature is raised to 750° C. to 800° C. which is maintained for 10 to 30 minutes to desorb and substitute the water molecules. Thereafter, the temperature is raised to a predetermined temperature to bring the concentration of water molecules and oxygen gas molecules to 5 ppm or less in water molecule conversion.

Furthermore, the hydrogen atmospheric heat treatment can also be effected in a furnace capable of $H_2$ treatment other than the epitaxial furnace, such as a low pressure CVD furnace or the like. In the case of a furnace whose internal temperature at the time of loading the substrate is 300° C. or more, such as the low pressure CVD furnace, this can be effected by gas substitution for a sufficient time after loading the Si wafer at a temperature from 300° C. to 800° C. with the water molecule concentration in the atmosphere being able to be brought to 5 ppm or less in water molecule conversion without substantially causing reaction with the Si wafer.

DETAILED DESCRIPTION OF PRESENTLY PREFERRED EMBODIMENTS

Embodiment 1

In the following, the relationship between a micro-roughness and a water molecule concentration in the hydrogen atmospheric heat treatment is described according to Embodiment 1.

Mirror polished (100) oriented CZ-Si single crystal wafers were heated for 10 minutes at four temperatures of 1000° C., 1050° C., 1100° C. and 1150° C. in hydrogen gas atmospheres containing, respectively, a water concentration of 0 ppm, 5 ppm, 10 ppm and 20 ppm.

Figure 1:
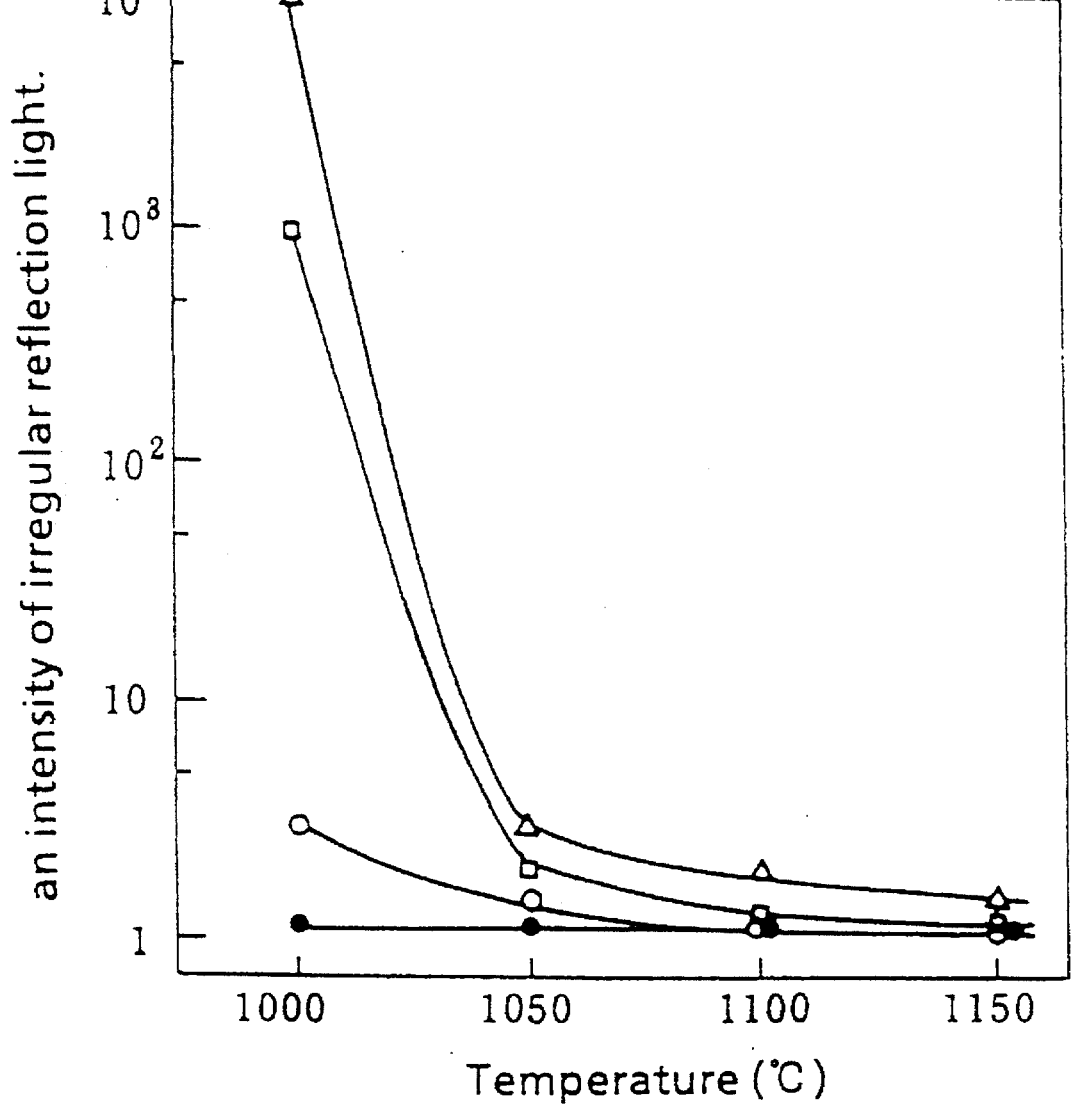
FIG. 1 is a graph showing the relationship between temperature and intensity of irregular reflection light.

Evaluation results of the micro-roughness of the Si wafers by use of a laser particle counter are shown in FIG. 1. In FIG. 1, the ordinate shows a rate of intensity of irregular reflection light against an intensity of incident laser ray, wherein the larger the value, the larger the micro-roughness of the Si wafer surface.

In Figure, 1 the symbol ● designates a water concentration of 0 ppm, the symbol ○ designates a water concentration of 5 ppm, the symbol □ designates a water concentration of 10 ppm, and the symbol Δ designates a water concentration of 20 ppm.

From the results of FIG. 1, it has been confirmed that the lower the temperature or the higher the water concentration, the micro-roughness of the Si wafer surface deteriorates. Also, in the case of mixing a small amount of oxygen in place of water, since the water is produced by a reaction with hydrogen, deterioration of micro-roughness similarly occurs.

From the fact mentioned above, by lowering the water or oxygen concentration in the heating hydrogen atmosphere to 5 ppm or less in water molecule conversion, the deterioration of the micro-roughness in a low temperature range can be prevented.

Embodiment 2

In the following, the relationship between the micro-roughness of the silicon wafer surface and gate oxide integrity (GOI) characteristics of a MOS diode is described according to Embodiment 2.

After forming a gate oxide film having a thickness of about 250 Å by heat oxidation of the silicon wafer treated in Embodiment 1 at 950° C. for 35 minutes in dry oxygen, a Poly-Si film was deposited to about 4000 Å in a low pressure CVD furnace. Further, P was doped in the Poly-Si film in a $POCl_3$ atmosphere.

The wafers were subjected to resist coat mask exposure, development, and etching to form a Poly-Si gate electrode having an area of 8 $mm^2$.

Figure 2:
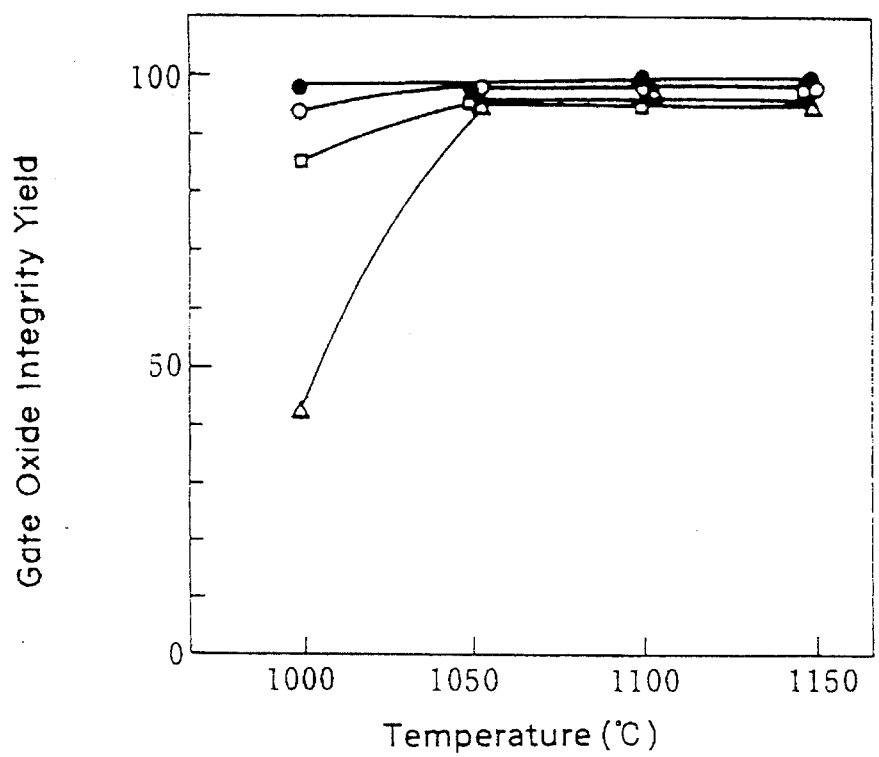
FIG. 2 is a graph showing the relationship between temperature and gate oxide integrity yield.

A gate oxide integrity yield of the MOS diodes is shown in FIG. 2. In judging as to being good or a failure, the MOS diode passing an electric current of 10 μA or more at an electric field strength of 8 Mv/cm or less was evaluated as a failure.

From FIG. 2, it is clear that the silicon wafer whose deterioration of the micro-roughness is remarkable in Embodiment 1 has a low gate oxide integrity yield.

Thereby, it has been confirmed that the gate oxide integrity characteristics are degraded by the deterioration of the micro-roughness of the silicon wafer surface.

Furthermore, by decreasing the water or oxygen concentration in the heating hydrogen atmosphere to 5 ppm or less in water molecule conversion, the deterioration of the micro-roughness was prevented and the degradation of the gate oxide integrity characteristic could be prevented.

Embodiment 3

In the following, the outward diffusion (or evaporation) of the electrically active impurity in the vicinity of the silicon substrate surface by the hydrogen atmospheric heat treatment and a method for suppressing the same are described according to Embodiment 3.

B-doped with a concentration of about $10^{15}$ atoms/$cm^3$, (100) orient CZ-Si substrates were heated for 120 minutes in a 100% hydrogen atmosphere and a hydrogen atmosphere containing 1.05 ppb of $B_2O_3$ at 1100° C.

Figure 3:
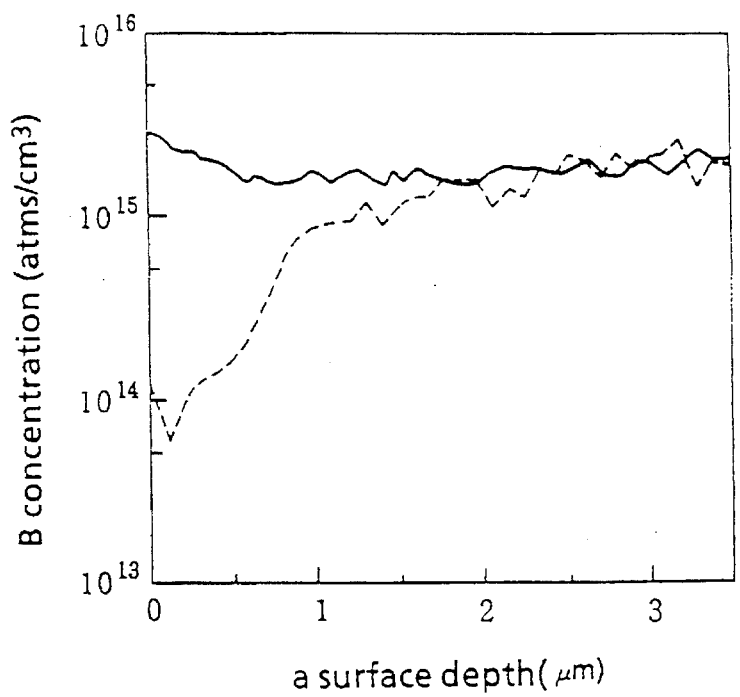
FIG. 3 is a graph showing the depth profile of a B concentration from the surface.

Results of B concentration by a spreading resistance measurement in a direction of depth from the surface, after dividing the wafers into about 5 mm squares and angle polishing at an intersecting angle of 1°9" with a mirror surface, are shown in FIG. 3.

From FIG. 3, it has been confirmed that the B concentration is decreased in a region of about 2 μm from the surface in the 100% hydrogen atmosphere (shown by a broken line in FIG. 3). However, in the case of treating in the atmosphere containing B (shown by a solid line in FIG. 3), the outward diffusion (or evaporation) of the impurity has not occurred.

Embodiment 4

An example of the method for decreasing the water or oxygen molecule concentration in hydrogen atmospheric heat treatment to 5 ppm or less is described according to Embodiment 4.

The water molecule concentration was continuously measured by connecting an atmospheric mass spectrometer to a sampling port provided at a furnace exhaust portion.

As a heating furnace, a vertical-type epitaxial reaction furnace of 100 l volume was used. After placing Si wafers on a carbon suscepter or table at room temperature, a bell jar was closed and atmospheric gas in the furnace was substituted with about 100 l/min of $N_2$ gas in 5 minutes and subsequently substituting for the $N_2$ gas about 100 l/min of $H_2$ gas in 5 minutes. The water molecule concentration in the furnace at this stage was 5 ppm or less.

Next, when the temperature was raised to 1000° C. in about 20 minutes while introducing the $H_2$ gas at about 90 l/min, the water molecule concentration increased with the rise in temperature, and after reaching the maximum value of about 20 ppm, the water molecule concentration decreased gradually, but it took more than 10 minutes to decrease below 5 ppm after reaching 1000° C.

The water molecules produced by the temperature rise are those stuck to the surface of the carbon suscepter and quartz bell jar which are the main furnace components, on contact with the outside atmosphere, and desorbed therefrom by the temperature rise.

It became clear by a Thermal Desorption Spectroscopy analysis that degassing desorption temperature from the carbon suscepter is between 50° to 250° C. with the peak temperature being at about 100° C.

It also became clear that a desorption amount is dependent on the time of contact with the outside atmosphere and the longer the contact time, the higher the desorption amount.

From the above facts, it is possible to suppress the water molecule absorption at the time of contact with the outside atmosphere by retaining the suscepter temperature at 300° C. when placing the wafer in the furnace.

When it is difficult to maintain at 300° C., the water molecule concentration can also be kept below 5 ppm by a method whereby the time of contact with the outside atmosphere is shortened as much as possible, and, after raising the temperature to 750° to 800° C. and desorbing and substituting the water molecules by maintaining that temperature for 10 to 30 minutes, the temperature is raised to a desired heating temperature. For example, in a furnace, such as an epitaxial reaction furnace whose internal temperature at the time of loading the substrate is greater than room temperature by 300° C. or less, after placing the semiconductor substrate on a heating table, atmospheric gas in the furnace is substituted by nitrogen gas, and while substituting further with hydrogen gas, the temperature is raised to 750° C. to 800° C. which is maintained for 10 to 30 minutes to desorb and substitute the water molecules. Thereafter, the temperature is raised to a predetermined temperature to bring the concentration of water molecules and oxygen gas molecules to 5 ppm or less in water molecule conversion.

In the above-mentioned maintained temperature (750° to 800° C.), although the water molecule concentration in the atmosphere exceeds 5 ppm, at this temperature the Si wafer is covered with a natural oxide film and substantially no reaction proceeds between the $H_2$ and water molecules.

Also in the case of hydrogen atmospheric heat treatment in a low pressure CVD furnace or the like, it has been confirmed that the water molecule concentration in the atmosphere can be suppressed below 5 ppm without substantially causing reaction with the Si wafer using gas substitution of $N_2$ for $H_2$ for a time sufficient, i.e., 10–30 mins. at a temperature from 600° to 800° C. after loading the Si wafer at the same temperature. For example, in the case of a furnace whose internal temperature at the time of loading the substrate is 300° C. or more, such as the low pressure CVD furnace, this can be effected by gas substitution for a sufficient time after loading the Si wafer at a temperature from 300° C. to 800° C. with the water molecule concentration in the atmosphere being able to be brought to 5 ppm or less in water molecule conversion without substantially causing reaction with the Si wafer.

Industrial Field of Application

The present invention is effective in (1) preventing deterioration of a micro-roughness produced at 950° C. to 1050° C. and (2) preventing variations of resistivity in the vicinity of the surface by heating a silicon wafer in a hydrogen atmosphere wherein atmospheric impurities, such as water, oxygen and the like, are below 5 ppm in water molecule conversion, and furthermore, the same kind of impurity gas as the electrically active impurity contained in a silicon substrate is contained at a predetermined concentration.

The present invention can be applied in heat treatment furnaces of any known configuration and by improving crystal quality in the vicinity of the wafer surface which is an active region of a semiconductor device, it is possible to improve the characteristics and yields of the semiconductor device.

What is claimed is:

1. In a method of manufacturing a semiconductor wafer, a method of heat treatment of a semiconductor silicon substrate during loading of the semiconductor silicon substrate in a furnace having an internal temperature of greater than room temperature by 300° C. or less, said method of heat treatment comprising: (a) loading the semiconductor silicon substrate onto a loading table which is in turn loaded in the furnace and thereafter replacing atmospheric gas in the furnace with a nitrogen gas atmosphere; (b) subsequently replacing the nitrogen gas atmosphere with a hydrogen gas atmosphere and raising the internal temperature to 750° C. to 800° C. in the hydrogen gas atmosphere, and maintaining this temperature for 10 to 30 minutes to desorb water and oxygen molecules, wherein replacement with the hydrogen gas atmosphere makes total concentration of water and oxygen molecules less than 5 ppm in water conversion; and (c) raising the internal temperature in the hydrogen gas atmosphere to a temperature in a range of from 950° C. to 1200° C. for heat treatment of the semiconductor silicon substrate in the hydrogen gas atmosphere.

* * * * *